United States Patent [19]

Tsukamoto et al.

[11] Patent Number: 4,916,508
[45] Date of Patent: Apr. 10, 1990

[54] CMOS TYPE INTEGRATED CIRCUIT AND A METHOD OF PRODUCING SAME

[75] Inventors: Katsuhiro Tsukamoto; Tatsuhiko Ikeda; Tatsuo Okamoto, all of Itami, Japan

[73] Assignee: Mitsubishi Denki Kabushiki Kaisha, Tokyo, Japan

[21] Appl. No.: 1,027

[22] Filed: Jan. 7, 1987

[30] Foreign Application Priority Data

Jan. 10, 1986 [JP] Japan ................................. 61-3796

[51] Int. Cl.⁴ .................... H01L 21/469; H01L 21/401
[52] U.S. Cl. ...................................... 357/59; 357/23.7; 357/71; 357/67
[58] Field of Search ...................... 357/23.9, 23.15, 71, 357/68, 67, 59, 23.11, 23.7

[56] References Cited

U.S. PATENT DOCUMENTS

| | | | |
|---|---|---|---|
| 4,554,572 | 11/1985 | Chatterjee | 357/23.7 |
| 4,616,401 | 10/1986 | Takeuchi | 357/23.9 |
| 4,621,276 | 11/1986 | Malhi | 357/23.9 |
| 4,727,044 | 2/1988 | Yamazaki | 357/23.7 |
| 4,754,314 | 6/1988 | Scott | 357/23.7 |
| 4,772,927 | 9/1988 | Saito et al. | 357/23.7 |

OTHER PUBLICATIONS

"Silicon-gate MOSFET with Self-Aligned Buried Source and Drain Contacts"-Ning-IBM Technical Disclosure Bulletin, vol. 23, No. 11-Apr. 1981, pp. 5190-5193.

"VLSI" Technology, S. M. Sze, ed., Chap. 11-4, pp. 461-473, 1983 McGraw-Hill Book Company.

Primary Examiner—Rolf Hille
Assistant Examiner—S. V. Clark

[57] ABSTRACT

A MOS type integrated circuit transistor includes: a channel region comprising a monocrystalline epitaxial layer; and a source/drain region of said transistor and a wiring region of a diffusion layer formed of a polycrystalline silicon layer grown on an embedded insulating film.

4 Claims, 4 Drawing Sheets

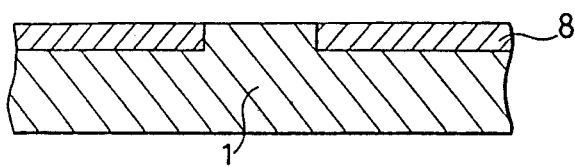
F I G. 2 (a)
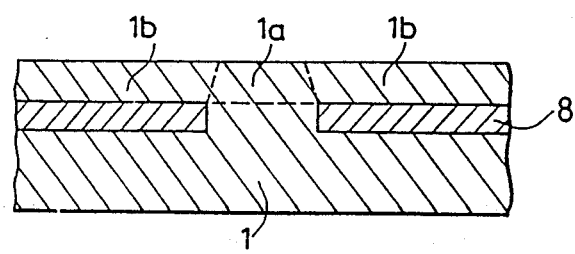
F I G. 2 (b)
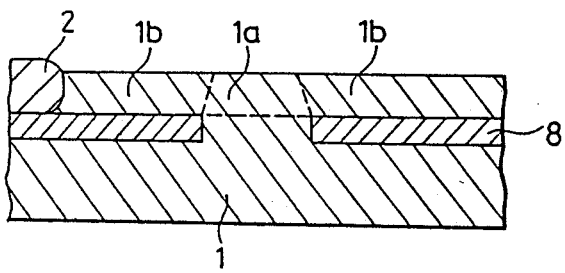
F I G. 2 (c)
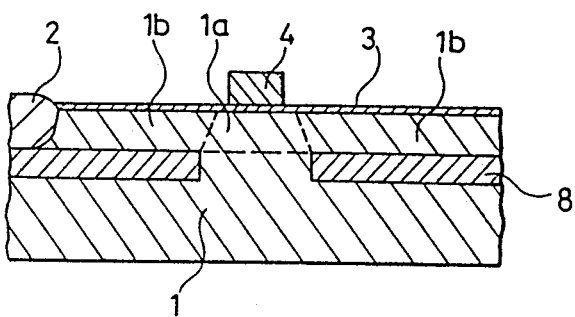
F I G. 2 (d)

FIG. 3(a)
(PRIOR ART)
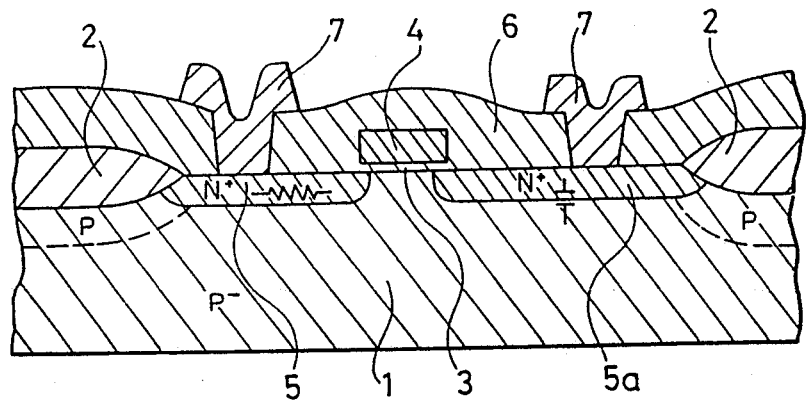
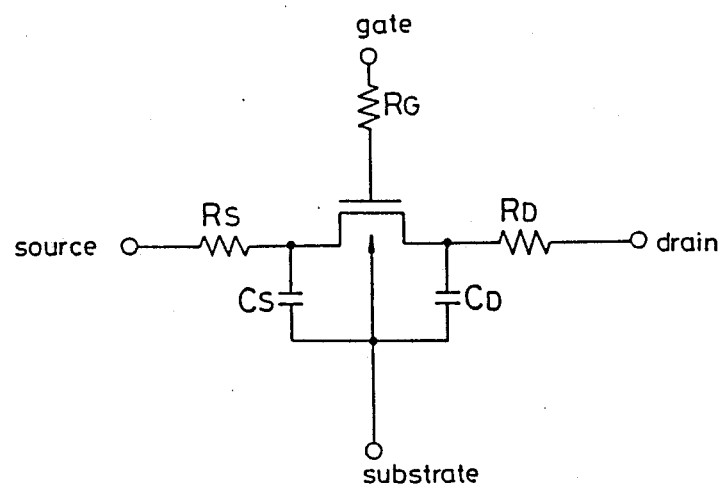
(PRIOR ART)
FIG. 3(b)

CMOS TYPE INTEGRATED CIRCUIT AND A METHOD OF PRODUCING SAME

FIELD OF THE INVENTION

The present invention relates to a MOS type integrated circuit and a method of producing same, and more particularly to a new element structure and a method of producing same that is capable of enhancing the property of a MOS transistor used in an integrated circuit.

BACKGROUND ART

FIG. 3(a) shows a cross-section of a prior art MOS transistor, and FIG. 3(b) shows an equivalent circuit thereof.

In the Figures, the reference numeral 1 designates a semiconductor substrate, and the reference numeral 2 designates an element-separating region comprising a thick insulating film. The reference numeral 3 designates a gate insulating film. The reference numeral 4 designates a gate electrode. The reference numerals 5 and 5a designate a source and a drain region. The reference numeral 6 designates a thick insulating film. The reference numeral 7 designates an aluminum wiring.

The gate electrode 4 is conventionally produced of a polycrystalline silicon into which impurities are doped at a high concentration, but it has a sheet resistance of several tens $\Omega/\square$. As the pattern is fine-patterned, the resistance is increased to a great extent, and recently a gate electrode having a double layer structure of a high melting point metal silicide and a polycrystalline silicon has been used.

On the other hand, the diffusion layer of the source/drain is required to have a shallow junction depth with the increase in the fineness of elements, and this results in the sheet resistance of the diffusion layer increasing to a great extent. For example, in an N+ type diffusion layer of about 0.2 $\mu$m junction depth, the sheet resistance becomes 50 to 100 $\Omega/\square$, and in a P+ type diffusion layer of about the same junction depth, the sheet resistance thereof becomes about 100 to 200 $\Omega/\square$, and the parasitic resistances $R_s$ and $R_D$ become a factor obstructing the element property. Furthermore, the diffusion layer of the source/drain requires a fairly large area for the production of a contact hole, and in cases where it is used as a portion of a wiring the parasitic capacitance produced between the diffusional layer and the substrate has a value which cannot be ignored and prevents the enhancement of the element performance.

Furthermore, since the diffusion layer cannot be used as a portion of a wiring due to the increase in resistance of the diffusion layer, wirings having the same structure as that of the aluminum wiring 7 or the gate electrode 4 comprising a high melting point metal silicide must be used for the internal wirings.

In the prior art MOS transistor with such a construction, a contact for connecting the diffusion layer and the internal wirings therefore has to be provided, and in producing the same a fairly large area is required to assure various overlapping preciseness. Furthermore, the number of contacts becomes tremendously large in a large sized integrated circuit, and the fraction of defective contacts affects adversely the yield of the integrated circuit device.

SUMMARY OF THE INVENTION

An object of the present invention is to provide an improved MOS type integrated circuit and a method of producing same capable of reducing the resistance of the gate electrode, and reducing the sheet resistance of the source/drain diffusion layer to a great extent, and furthermore that is capable of eliminating the contact holes for internal wirings by using a portion of the source/drain low resistance diffusion layer as an internal wiring.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a MOS type integrated circuit, which comprises: a channel region of a transistor comprising a monocrystalline epitaxial layer; and source/drain region of said transistor and a wiring region of diffusion layer comprising a polycrystalline silicon layer grown on an embedded insulating film.

BRIEF DESCRIPTION OF THE DRAWINGS

FIG. 3 (a) is a cross-sectional view showing a structure of a prior art MOS transistor and FIG. 3(b) is a diagram showing an equivalent circuit thereof, respectively.

DETAILED DESCRIPTION OF THE PREFERRED EMBODIMENTS

Figure 1:
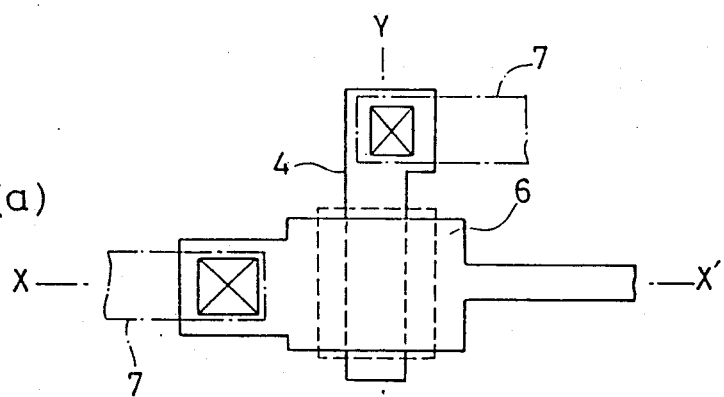
FIG. 1(a) is a plan view showing a structure of a MOS type integrated circuit as an embodiment of the present invention and FIGS. 1(b) and (c) are cross-sectional views in the X—X' direction and in the Y—Y' direction of FIG. 1(a), respectively.

In order to describe the present invention in detail, reference will be particularly made to FIG. 1.

Figure 1B:
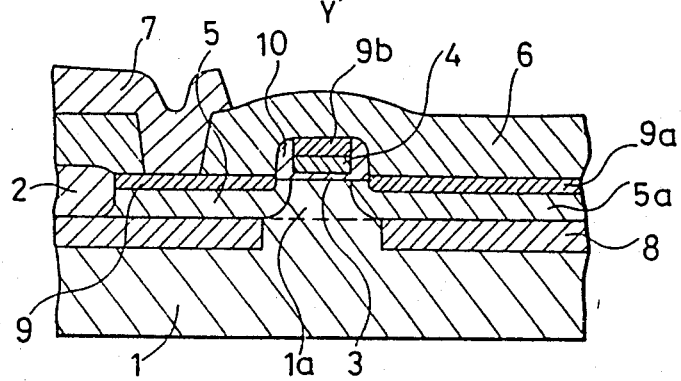
Figure 1C:
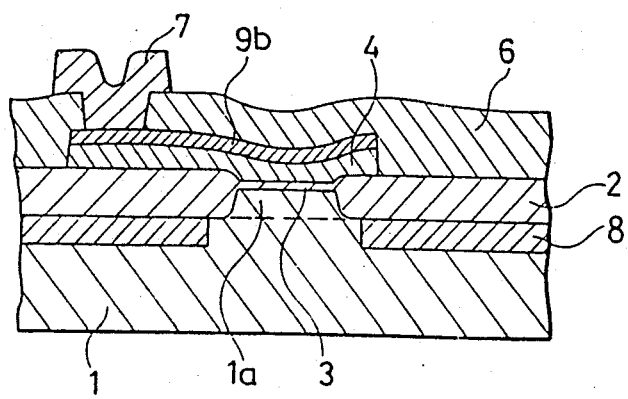

FIG. 1 (a) is a plan view showing an embodiment of the present invention, and FIGS. 1(b) and (c) are cross-sectional views in the X—X' direction and in the Y—Y' direction of FIG. 1(a), respectively. In FIG. 1, the reference numeral 1 designates a semiconductor substrate, the reference numeral 2 designates an element-separating region, the reference numeral 3 designates a gate insulating film, the reference numeral 4 designates a gate electrode, the reference numerals 5 and 5a designate a source and a drain region, respectively. The reference numeral 6 designates a thick oxide film, the reference numeral 7 designates an aluminum wiring, the reference numeral 8 designates an embedded insulating film, the reference numerals 9, and 9a, and 9b designate a high melting point metal silicide, respectively, and the reference numeral 10 designates a side wall of the gate.

In this embodiment, contrary to the channel region being produced inside the epitaxial layer grown on the silicon substrate 1, the source and the drain regions 5 and 5a are produced inside the polycrystalline silicon layer grown on the embedded insulating film 8. This results in a large reduction in the parasitic capacitance between the source/drain and the substrate.

Furthermore, the high melting point metal silicides 9, 9a, and 9b are produced on the surfaces of the source and drain 5 and 5a, and the gate electrode 4 is self aligned by utilizing the side wall of the gate 10. This construction makes the resistance of the gate electrode and the source/drain eminently small. Thus, in this embodiment, the diffusion layers of the source/drain can be utilized as internal wirings of a low resistance, and thus the source/drain transfers to the internal wirings continuously without using contact holes. Thus, the number of contact holes which causes reduction in the yield can be reduced to a great extent as well as eliminating the area occupied by the contact holes, thereby resulting in a high integration concentration.

Besides, as high melting point metal silicides 9, 9a, and 9b titanium silicide, tungsten silicide, molybdenum silicide, tantalum silicide, and zirconium silicide can be used. Furthermore, the high melting point metal silicides 9, 9a, and 9b can be replaced by a high melting point metal such as molybdenum, tungsten.

The method of producing the above-described embodiment will be described.

Figure 2:
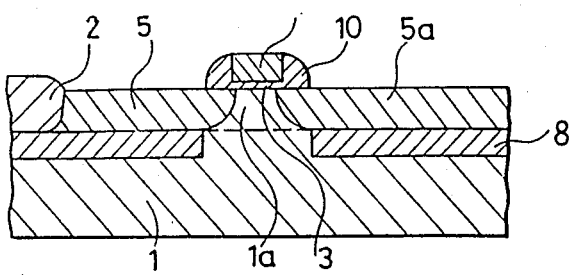
FIG. 2 (a) to (h) are cross-sectional views showing the process of producing the device of the above described embodiment.
Figure 2:
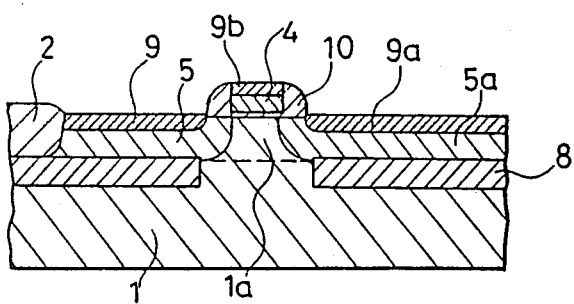
Figure 2:
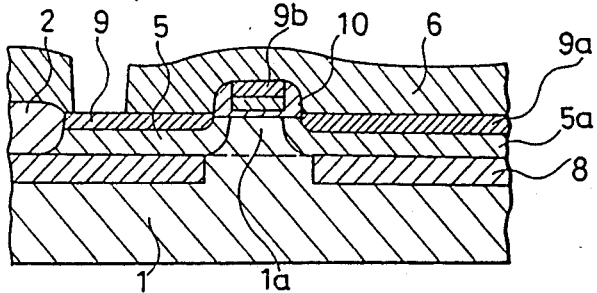
Figure 2:
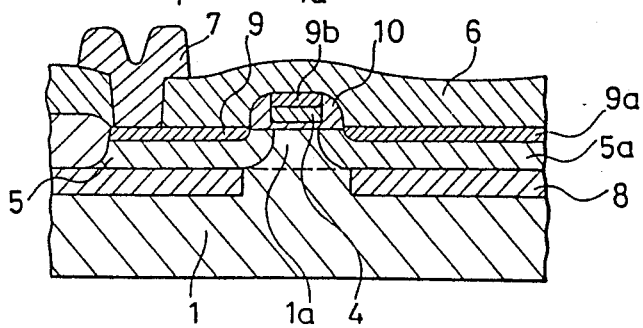

First, a pattern of insulating film 8 such as silicon dioxide having an aperture at a portion corresponding to the channel region of a transistor is produced on the surface of the semiconductor substrate 1 as shown in FIG. 2(a) (first process). Meanwhile, in producing the insulating film 8 it is desirable to produce a so-called recessed structure by conducting a shallow etching on the semiconductor substrate 1 so as to maintain the flatness of the surface of the element.

Next, silicon films 1a and 1b of about 0.3~2 μm thickness are grown by an epitaxial method on the surface of the semiconductor substrate 1 as shown in FIG. 2(b) (second process). Then, a monocrystalline silicon 1a is epitaxially grown on a portion where the semiconductor substrate is exposed, and a polycrystalline silicon film 1b is grown on the insulating film 8. Thus, a structure including an embedded insulating film 8 is obtained.

Subsequently thereto, as shown in FIG. 2(c), an element separation region 2 comprising a thick insulating film which partitions the grown silicon film 1a and 1b is produced (third process). In this process a method of growing a thick oxide film only on the element separation region with the use of the usual selective oxidation method can be used. Meanwhile, a construction is obtained where the element separation region 2 is in contact with the embedded insulating film 8, and the bottom surface and the side surface of the active element region except for the channel region thereof are all coated by an insulating film.

Next as shown in FIG. 2(d), a gate insulating film 3 is produced, a gate electrode 4 comprising polycrystalline silicon is produced thereon, and subsequently thereto as shown in FIG. 2(e), a side wall 10 is produced in contact with the side wall of the gate electrode 4 (fourth process). In this process, an insulating film such as silicon dioxide is accumulated on the entire surface of the substrate, and an etching is conducted to the accumulated insulating film by etching method having directionality such as reactive ion etching, whereby an insulating film 10 remains only at the side wall of the gate electrode 4.

Furthermore, high density impurities are ion injected into the polycrystalline silicon film 1b with the gate electrode 4 as a mask, and the source and drain regions 5 and 5a are thereby produced (fourth process). Then, in order to reduce the leakage current of the transistor it is important that the source and drain regions 5 and 5a are diffused toward the region of the monocrystalline silicon film 1a from the polycrystalline film 1b to some degree, and that the channel region of the transistor is produced only within the region of the monocrystalline silicon layer 1a.

Subsequently thereto, as shown in FIG. 2(f), high melting point metal silicides 9, 9a, and 9b are produced on the surface of the gate and the source/drain self alignedly by utilizing the side wall 10. In this process, a high melting point metal silicide such as titanium is accumulated on the surface of the substrate by a sputtering method, for example, and a heat processing of about 600° C. is conducted by a lamp heating method. Then, a high melting point metal silicide such as titanium silicide is produced only at a portion which is in contact with the silicon, and the high melting point metal such as titanium remains with no reaction on the insulating films such as the element separation region 2 or the side wall 10. This principle is described in an article "Self-Aligned Titanium Silicidation by Lamp Annealing" Extended Abstract of the 16th Conference on Solid Devices and Materials, Kobe 1984, page 47. When only this non-reacting high melting point metal is selectively removed, it is possible to produce a high melting point metal silicide self alignedly. Thus, high melting point metal silicides 9, 9a, and 9b are produced at the surfaces of the source and drain, and the gate of the transistor, and the source and drain, and the gate subsequently have quite a low sheet resistance below 2 Ω/□.

Furthermore, a high melting point metal silicide is produced on the surface of the wiring which is also produced by the diffusion layer similar to the source and the drain, and this also has quite a low resistance below 2 Ω/□, and thus it is possible to realize a structure in which the source and drain transfers to a wiring continuously without using contact holes. Furthermore, the wiring comprising the diffusion layer is completely separated from the substrate by the embedded insulating film 8, whereby a wiring having quite a small parasitic capacitance is obtained.

Subsequently thereto, as shown in FIG. 2(g), a thick insulating film 6 is accumulated, contact holes are apertured, and thereafter, as shown in FIG. 2(h), an aluminum wiring 7 is wired to complete the process of producing the element (sixth process).

As described above, in the present embodiment, the source/drain region and the internal wiring thereof both comprising a diffusion layer of polycrystalline silicon layer are produced inside the polycrystalline silicon produced on the embedded insulating film, and therefore, the parasitic capacitance between the diffusion layer such as the source/drain and the substrate is quite small. Furthermore, a high melting point metal silicide is produced on the surface of the gate electrode and the diffusion layer, and therefore, quite a low resistance gate electrode and source/drain region is obtained, and a structure in which the source/drain region transfers continuously to a low resistance wiring without using contact holes is realized.

In the illustrated embodiment, a unipolar MOS type integrated circuit is described, but the present invention can be also applied to a CMOS integrated circuit with an eminent advantage of avoiding a latch-up phenomenon.

As is evident from the foregoing description, according to the present invention, the source/drain and the other diffusion layer are produced in a polycrystalline silicon layer on an embedded insulating film, whereby a sheet resistance of the source/drain diffusion layer is reduced to a great extent, and furthermore, a connection from the source/drain diffusion layer to the low resistance internal wiring can be executed without using contact holes.

What is claimed is:

1. A MOS type integrated circuit, comprising:
   an embedded insulator film formed on a semiconductor substrate to expose a portion of surface of said semiconductor substrate,
   a first conductivity type monocrystalline silicon layer produced on said portion of said semiconductor substrate, to constitute a channel region of a MOS transistor;
   polycrystalline silicon layers formed on said embedded insulator film adjacent said monocrystalline silicon layer at each side thereof;
   second conductivity type source and drain regions of said MOS transistor formed in said polycrystalline silicon layers;
   a gate electrode of said MOS transistor formed on said monocrystalline channel region via a gate insulator; and
   high melting point metal silicide layers formed on said source/drain regions, respectively.

2. A MOS type integrated circuit as defined in claim 1, further comprising a high melting point metal or a high melting point metal silicide provided on the surface of said source/drain regions.

3. A MOS type integrated circuit as defined in claim 1, wherein molybdenum or tungsten is used as said high melting point metal.

4. A MOS type integrated circuit as defined in claim 1, wherein titanium silicide, tungsten silicide, molybdenum silicide, tantalum silicide, or zirconium silicide is used as said high melting pint metal silicide.

* * * * *